(12) United States Patent  
Cheng

(10) Patent No.: US 9,756,754 B2  
(45) Date of Patent: Sep. 5, 2017

(54) INTEGRATED POWER MODULE PACKAGING STRUCTURE

(71) Applicant: DELTA ELECTRONICS, INC., Taoyuan (TW)

(72) Inventor: Tsung-Tai Cheng, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 22 days.

(21) Appl. No.: 15/083,300

(22) Filed: Mar. 29, 2016

(65) Prior Publication Data

US 2017/0118858 A1 Apr. 27, 2017

(30) Foreign Application Priority Data

Oct. 23, 2015 (TW) .............................. 104134798 A

(51) Int. Cl.
| | |
|---|---|
| *H02M 1/36* | (2007.01) |
| *H05K 7/14* | (2006.01) |
| *H05K 5/00* | (2006.01) |
| *H05K 5/02* | (2006.01) |
| *H05K 7/06* | (2006.01) |
| *H05K 1/18* | (2006.01) |

(52) U.S. Cl.
CPC ........... *H05K 7/1427* (2013.01); *H05K 1/181* (2013.01); *H05K 5/0069* (2013.01); *H05K 5/0247* (2013.01); *H05K 7/06* (2013.01); *H05K 2201/10053* (2013.01); *H05K 2201/10151* (2013.01); *H05K 2201/10318* (2013.01)

(58) Field of Classification Search
None
See application file for complete search history.

(56) References Cited

U.S. PATENT DOCUMENTS

| | | | |
|---|---|---|---|
| 7,592,696 B2 | 9/2009 | Hable | |
| 2004/0222752 A1* | 11/2004 | Yamanaka | H05B 41/02 315/291 |
| 2005/0224946 A1* | 10/2005 | Dutta | G02B 6/12002 257/686 |
| 2011/0228436 A1* | 9/2011 | Lee | 361/93.7 |
| 2012/0075816 A1* | 3/2012 | Mashimo | H01L 21/565 361/760 |

(Continued)

FOREIGN PATENT DOCUMENTS

| | | |
|---|---|---|
| CN | 101533834 A | 9/2009 |
| CN | 102903693 A | 1/2013 |
| TW | 201431268 A | 8/2014 |

*Primary Examiner* — Xanthia C Cunningham
(74) *Attorney, Agent, or Firm* — CKC & Partners Co., Ltd.

(57) ABSTRACT

An integrated power module packaging structure includes a housing, a first circuit board, a second circuit board, a first pin, a second pin and a third pin. The housing has a cavity. The second circuit board is located above the first circuit board, and both them are received in the cavity. A switching module is disposed on the first circuit board. A high side current/voltage detecting device and a driving device are disposed on the second circuit board. The first pin, the second pin and the third pin are disposed between the first circuit board and the second circuit board. The first pin connects the high side current/voltage detecting device and the switching module in series. The second pin connects the switching module. The driving device controls the switching module through the third pin.

10 Claims, 4 Drawing Sheets

(56) References Cited

U.S. PATENT DOCUMENTS

| | | | | |
|---|---|---|---|---|
| 2012/0188712 A1* | 7/2012 | Ishibashi | ............... | H02M 7/003 |
| | | | | 361/688 |
| 2014/0266832 A1* | 9/2014 | Schrom | ................ | H02M 3/157 |
| | | | | 341/144 |
| 2015/0036252 A1* | 2/2015 | Imanishi | .............. | H02H 7/1227 |
| | | | | 361/91.5 |
| 2015/0244301 A1* | 8/2015 | Sato | ........................ | H02P 27/06 |
| | | | | 318/139 |
| 2015/0311795 A1* | 10/2015 | Yang | .................... | H02M 3/156 |
| | | | | 323/271 |
| 2015/0321574 A1* | 11/2015 | Oi | ......................... | B60L 3/0007 |
| | | | | 307/10.1 |
| 2016/0352215 A1* | 12/2016 | Momose | ................ | B60L 11/18 |
| 2016/0352246 A1* | 12/2016 | Lai | ........................ | H02M 7/003 |
| 2017/0012565 A1* | 1/2017 | Oi | ......................... | H02P 27/085 |
| 2017/0018383 A1* | 1/2017 | Herzog | ................ | H01H 47/002 |
| 2017/0071257 A1* | 3/2017 | Lin | ......................... | A24F 47/00 |

\* cited by examiner

INTEGRATED POWER MODULE PACKAGING STRUCTURE

RELATED APPLICATIONS

This application claims priority to Taiwan Application Serial Number 104134798, filed Oct. 23, 2015, which is herein incorporated by reference.

BACKGROUND

Field of Invention

The present invention relates to a packaging structure. More particularly, the present invention relates to an integrated power module packaging structure.

Description of Related Art

With rapid development of global automation and power saving, speed governors are widely used in various fields. Inverters and motors are utilized for providing different speeds. A conventional integrated power module only integrates the switch module and the bridge rectifier of the inverter. The other devices, such as the driving device, does not have to be integrated into the conventional integrated power module. Moreover, some detection devices are needed to detect the high/low side voltage/current of the inverter for industry control requirement. These devices need additional isolation configuration, which causes a situation in which the size and the weight of the inverter is difficult to be reduced. However, the trend of the related products is that of minimization, high power, and high density.

SUMMARY

The present invention provides an integrated power module packaging structure, in which a detecting device, a driving device and a switching module are integrated in a packaging structure to form a three-dimensional stacking structure for saving space.

An aspect of the invention provides an integrated power module packaging structure, which includes a housing, a first circuit board, a second circuit board, a first pin, a second pin and a third pin. The housing has a cavity. The second circuit board is located above the first circuit board, and both them are received in the cavity. A switching module is disposed on the first circuit board. A high side current/voltage detecting device and a driving device are disposed on the second circuit board. The first pin, the second pin and the third pin are disposed between the first circuit board and the second circuit board. The first pin connects the high side current/voltage detecting device and the switching module in series. The second pin connects the switching module. The driving device controls the switching module through the third pin.

In one embodiment, a low side current detecting device is disposed on the first circuit board. The first pin further connects the low side current detecting device and the switching module in series.

In one embodiment, a third circuit board is disposed out the housing. A power supply device is disposed on the third circuit board. The power supply device has a positive voltage terminal and a negative voltage terminal.

In one embodiment, a fourth pin is disposed between the second circuit board and the third circuit board and connected to the positive voltage terminal of the power supply. The high side current/voltage detecting device and the switching module that are connected in series are connected to the positive voltage terminal of the power supply through the first pin and the fourth pin. The low side current detecting device and the switching module that are connected in series are connected to the negative voltage terminal of the power supply through the second pin.

In one embodiment, a fifth pin is disposed on the second circuit board. The high side current/voltage detecting device detects the power supply device to generate a high side current/voltage detecting signal to the fifth pin.

In one embodiment, a sixth pin is disposed on the first circuit board and passing through the second circuit board. The low side current detecting device detects the power supply device to generate a low side current detecting signal to the sixth pin.

In one embodiment, a controller is disposed out the housing. The controller receives the high side current/voltage detecting signal from the fifth pin and the low side current detecting signal from the sixth pin.

In one embodiment, the controller is disposed on the third circuit board.

In one embodiment, a seventh pin is disposed between the second circuit board and the third circuit board. The controller controls the driving device through the seventh pin.

In one embodiment, the switching module comprises a power device.

Accordingly, comparing with the conventional packaging structure, the integrated power module packaging structure of the present invention has a stacked package structure, so that elements are sequentially disposed on substrates that are stacked to each other, which improves the density among the elements. Moreover, the structure not only integrates the switching module but also integrates a key element, a high side current/voltage detecting device, which is benefit in packaging.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE EMBODIMENTS

Figure 1:
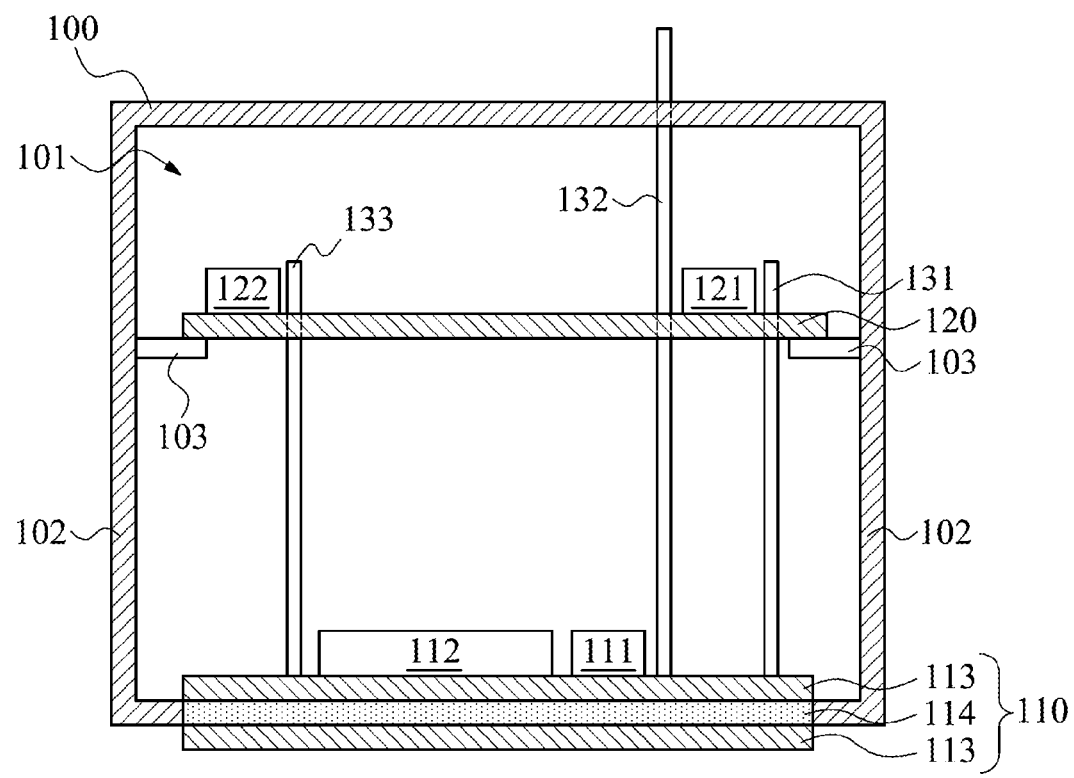
FIG. 1 is a cross-sectional view of an integrated power module packaging structure according to an embodiment of the invention.

Reference will now be made in detail to the present embodiments of the invention, examples of which are illustrated in the accompanying drawings. Wherever possible, the same reference numbers are used in the drawings and the description to refer to the same or like parts.

The integrated power module packaging structure of the present invention includes not only the switch module but also the current/voltage detection device with key features. Moreover, a stacked package structure is used, so that elements are sequentially disposed on substrates that are stacked to each other. Such a structure improves the density among the elements, which not only reduces the overall volume of the power module but also integrates an additional key element into this power module even though the overall volume is reduced, which is benefit in packaging. Moreover, the stacked structure shorts the traces between the elements to avoid noise caused by the traces that may be too long, which may reduce the noise interference.

Figure 2:
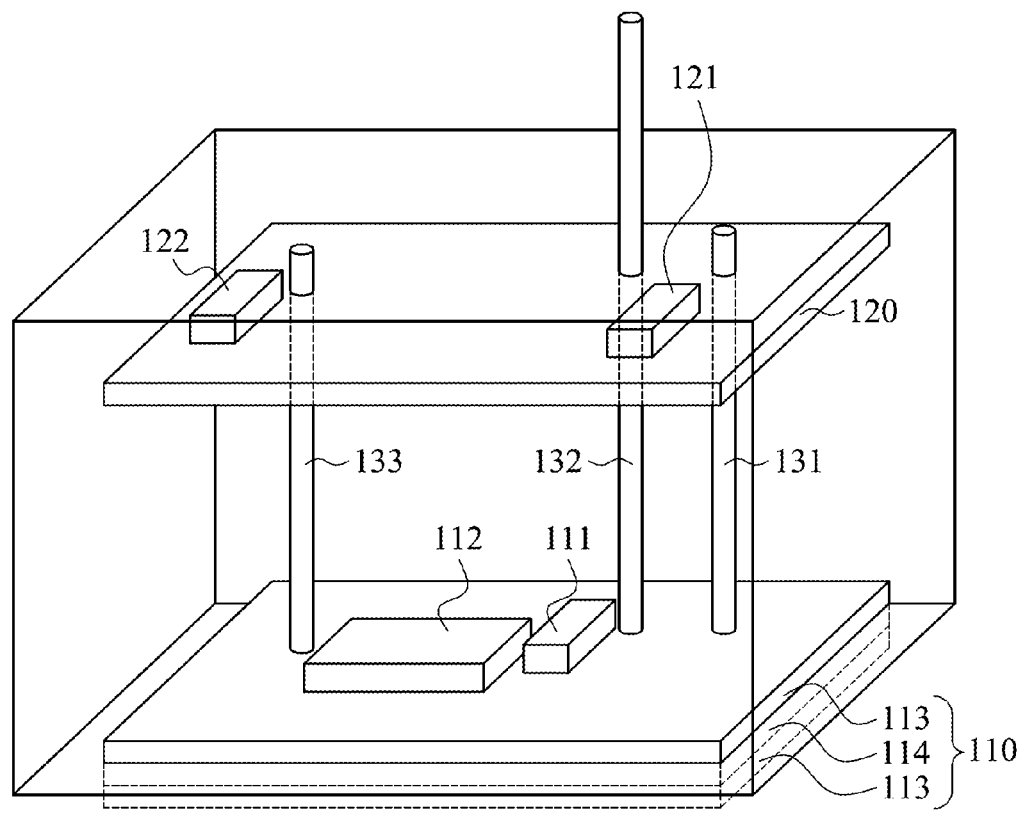
FIG. 2 is a three-dimensional view of an integrated power module packaging structure according to an embodiment of the invention.

FIG. 1 is a cross-sectional view of an integrated power module packaging structure according to an embodiment of the invention. FIG. 2 is a three-dimensional view of an integrated power module packaging structure according to an embodiment of the invention. Please refer to FIG. 1 and FIG. 2. The integrated power module packaging structure 10 comprises a housing 100, a first circuit board 110, a second circuit board 120 and three pins, respectively a first pin 131, a second pin 132 and a third pin 133. The housing 100 has a cavity 101. The housing 110 includes a sidewall 102 surrounding the cavity 101. A support portion 103 is disposed on the sidewall 102 and projected out the sidewall 102 for supporting the second circuit board 120.

The first circuit board 110 and the second circuit board 120 are received in the cavity 101. The first circuit board 110 may be fixed connected to the housing 100 through an adhesive material and the like. A switch module 112 is disposed on the first circuit board 110. In an embodiment, the switch module 112 can be an IGBT, a MOSFET, a diode, etc. The switch module 112 may be a single switch or switches that are formed by a plurality of different connection combinations. The switch module 112 generates lots of heat while operating. Therefore, the first circuit board 110 can be a substrate with good thermal dissipation ability. For example, the first circuit board 110 can include a ceramic substrate 114 and a copper layer 113 coated on the ceramic substrate 114. The copper is a material with good thermal dissipation ability, so that the heat generated by the switch module 112 can be dissipated rapidly. The switch module 112 is disposed at an upper surface of the ceramic substrate 114. The pattern of the copper layer 113 includes some spaces for locating the pins of the switch module 112. Such that the situation of shortcuts between the pins of the switch module 112 due to contacting the copper layer 113 can be prevented. The second circuit board 120 is located above the first circuit board 110. The second circuit board 120 is fixed connected to the support portion 103 on the sidewall 102 through an adhesive material and the like. By such stacked structure, the length of the traces between the first circuit board 110 and the second circuit board 120 is the shortest, which can avoid the noise caused by longer traces to interfere the operating of the devices. The second circuit board 120 is a drive board. A high side current/voltage detecting device 121 and a driving device 122 are disposed on the second circuit board 120. The high side current/voltage detecting device 121 is a detecting device disposed in the positive (+) voltage terminal, wherein the current detecting section may use shunt resistors to detect the current, and the voltage detection section may use the voltage detecting circuit in the positive (+) voltage terminal to detect the voltage. The second circuit board 120 is a multilayer printed circuit board. By a metal signal wiring of the multilayer printed circuit board, the signals of the high side current/voltage detecting device 121 and the driving device 122 are guided to the corresponding first pin 131, the second pin 132 or the third pin 133 respectively to transmit to the switch module 112 of the first circuit board 110.

The first pin 131, the second pin 132 and the third pin 133 are disposed between the first circuit board 110 and the second circuit board 120. The first pin 131 is used to connect the high side current/voltage detecting device 121 of the second circuit board 120 with the switch module 112 of the first circuit board 110 in series. The second pin 132 connects with the switch module 112. The second pin 132 will protrude outside the housing 100 to electrically connect with an external component. The first pin 131 does not protrude out the housing 100. The third pin 133 connects the driving device 122 with the switching module 112 such that the driving device 122 can control the switching module 112 through the third pin 133.

Figure 3:
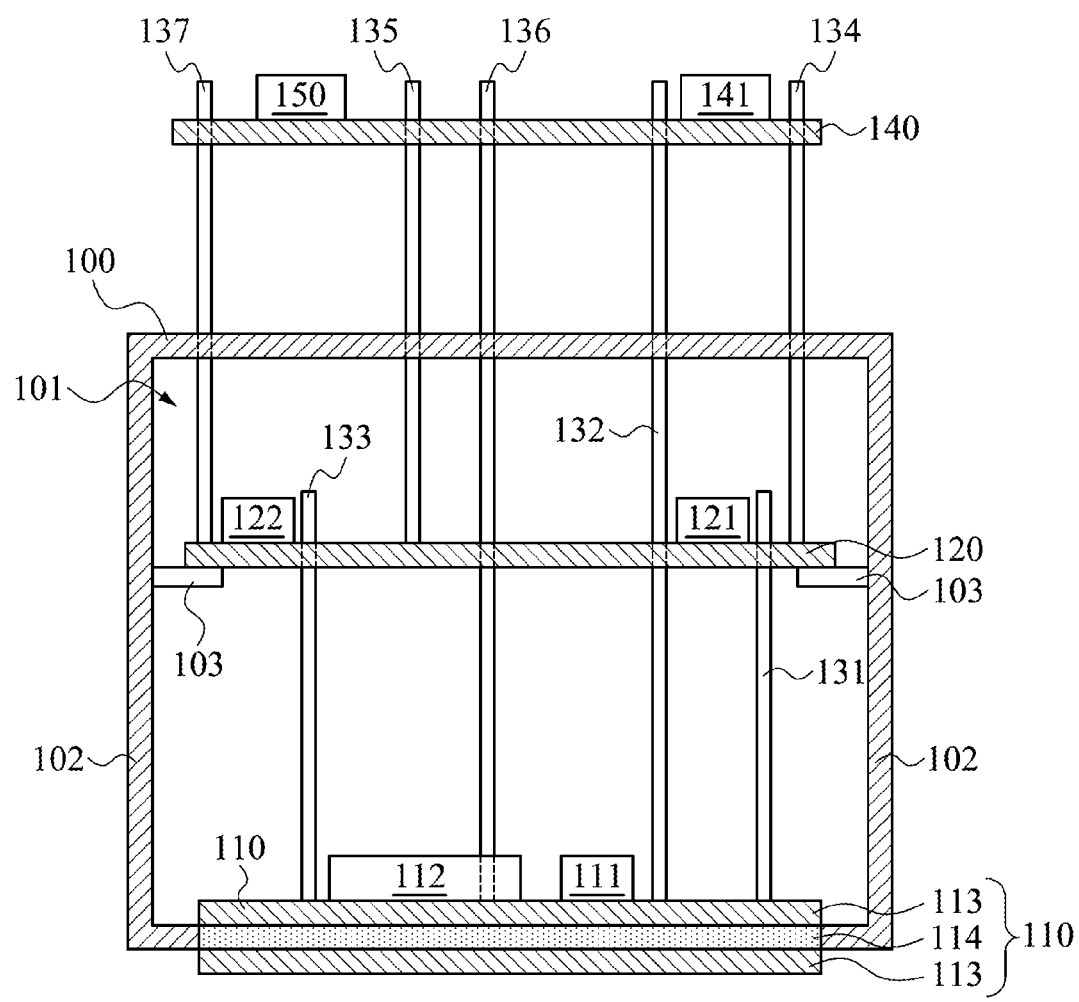
FIG. 3 is a cross-sectional view of an integrated power module packaging structure and an outside circuit board according to an embodiment of the invention.
Figure 4:
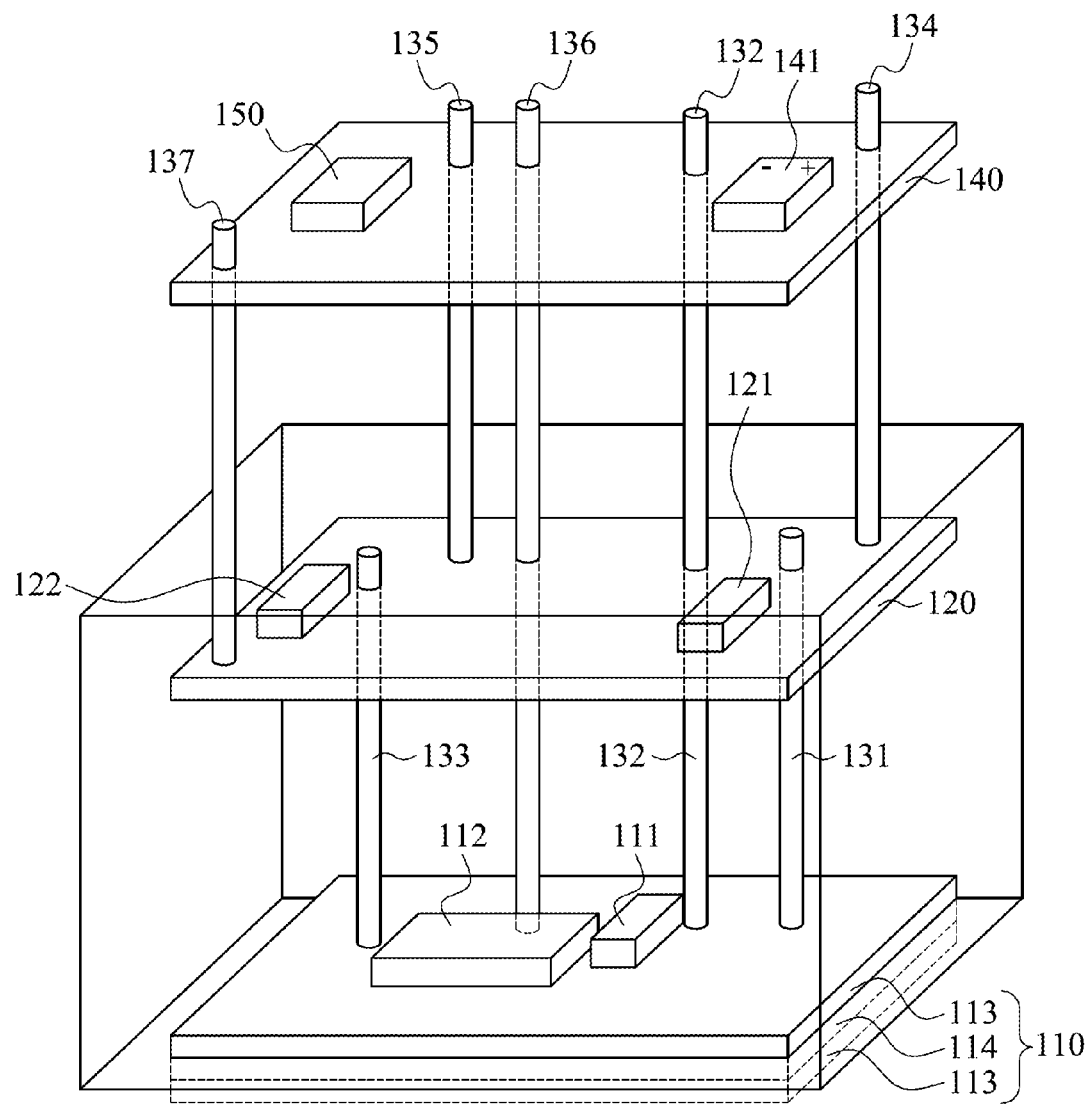
FIG. 4 is a three-dimensional view of an integrated power module packaging structure and an outside circuit board according to an embodiment of the invention.

Moreover, a low side detection device 111 is further disposed on the first circuit board 110. The low side current detection device 111 is a detecting device disposed at a negative (−) voltage terminal, wherein the current detecting section may use shunt resistors to detect the current. The low side current detecting device 111 is connected to the first pin 132. That is, the high side current/voltage detecting device 121 on the second circuit board 120 is connected to the low side current detecting device 111 and the switching module 112 on the first circuit board 110 in series through the first pin 131 and the second pin 132. In another embodiment, since the switching module 112 connects the second pin 132, and the second pin 132 protrudes out the housing 100 and electrically connects an external component, a third circuit board 140 is disposed out the housing 100 as shown in FIG. 3 and FIG. 4. FIG. 3 is a cross-sectional view of an integrated power module packaging structure and an outside circuit board according to an embodiment of the invention. FIG. 4 is a three-dimensional view of an integrated power module packaging structure and an outside circuit board according to an embodiment of the invention. In this embodiment, a power supply device 141 is disposed on the third circuit board 140. The power supply device 141 has a positive (+) voltage terminal and a negative (−) voltage terminal.

In order to supply power to the high side current/voltage detecting device 121 on the second circuit board 120 and the switching module 112 and the low side current detecting device 111 on the first circuit board 110, a fourth pin 134 is disposed between the second circuit board 120 and the third circuit board 140 to connect with the positive (+) voltage terminal of the power supply device 141. The second pin 132 protruded out the housing 100 is connected to the negative (−) voltage terminal of the power supply device 141. Accordingly, the low side current detecting device 111 and the switching module 112 on the first circuit board 110, and the high side current/voltage detecting device 121 on the second circuit board 120 are connected to the negative (−) voltage terminal and the positive (+) voltage terminal of the power supply device 141 to form a circuit loop through the first pin 131, the second pin 132 and the fourth pin 134. It is worth mentioning that the above-described circuit loop may include an additional energy storage element, such as an inductor, located out the housing 100. Therefore, the power supply device 141 may supply power to the low side detecting device 111, the switch module 112 and the high side current/voltage detecting device 121 through this circuit loop, in which the switch module 112 comprises a power device.

On the other hand, a controller 150 disposed outer the housing 100 may output a control signal to control the driving device 122 to control the duty cycle of the switching module 112 through the third pin 133, in order to adjust the output power from the integrated power module. The controller 150 outputs the control signal to the driving device 122 according to the high side current/voltage detection signal generated by the high side current/voltage detecting device 121 detecting the power supply device 141, or the low side current detection signal generated by the low side current detecting device 111 detecting the power supply device 141. Therefore, for transmitting the high side current/voltage detection signal generated by the high side current/voltage detecting device 121 on the second circuit board 120 and the low side current detection signal generated by the low side current detecting device 111 on the first circuit board 110 to the controller 150, a fifth pin 135 is disposed on the second circuit board 120 to guide the high side current/voltage detection signal to the controller 150 and a sixth pin 136 passing through the second circuit board 120 is disposed on the first circuit board 110 to guide the low side current detection signal to the controller 150.

In an embodiment, the controller 150 may be disposed on the third circuit board 140. Accordingly, the fifth pin 135 is disposed between the second circuit board 120 and the third circuit board 140 to guide the high side current/voltage detecting signal generated by the high side current/voltage detecting device 121 on the second circuit board 121 to the controller 150 on the third circuit board 140. The sixth pin 136 is disposed between the first circuit board 110 and the third circuit board 140 and passes through the second circuit board 120 to guide the low side current detecting signal generated by the low side current detecting device 111 on the first circuit board 110 to the controller 150 on the third circuit board 140. Moreover, a seventh pin 137 is disposed between the second circuit board 120 and the third circuit board 140 for transmitting the control signal outputted from the controller 150 to the driving device 122 on the second circuit board 120. Accordingly, the controller 150 may control the driving device 122 through the seventh pin 137 to control the duty cycle of the switching module 112 on the first circuit board 110, so that the output power of the integrated power module 10 can be adjusted.

Accordingly, the integrated power module packaging structure has a stacked package structure, so that elements are sequentially disposed on substrates that are stacked to each other. Such structure improves the density among the elements. Moreover, the integrated power module packaging structure not only integrates the switching module but also integrates a key element, a high side current/voltage detecting device, which is benefit in packaging.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An integrated power module packaging structure comprising:
　a housing having a cavity;
　a first circuit board received in the cavity, wherein a switching module is disposed on the first circuit board;
　a second circuit board received in the cavity and located above the first circuit board, wherein a high side current/voltage detecting device and a driving device are disposed on the second circuit board; and
　a first pin, a second pin and a third pin disposed between the first circuit board and the second circuit board, wherein the first pin connects the high side current/voltage detecting device and the switching module in series, and the second pin connects the switching module, and the driving device controls the switching module through the third pin.

2. The integrated power module packaging structure of claim 1, further comprising a low side current detecting device disposed on the first circuit board, wherein the first pin further connects the low side current detecting device and the switching module in series.

3. The integrated power module packaging structure of claim 2, further comprising a third circuit board disposed out the housing, wherein a power supply device is disposed on the third circuit board, and the power supply device has a positive voltage terminal and a negative voltage terminal.

4. The integrated power module packaging structure of claim 3, further comprising a fourth pin disposed between the second circuit board and the third circuit board and connected to the positive voltage terminal of the power supply,
　wherein the high side current/voltage detecting device and the switching module that are connected in series are connected to the positive voltage terminal of the power supply through the first pin and the fourth pin, and
　wherein the low side current detecting device and the switching module that are connected in series are connected to the negative voltage terminal of the power supply through the second pin.

5. The integrated power module packaging structure of claim 4, further comprising a fifth pin disposed on the second circuit board, wherein the high side current/voltage detecting device detects the power supply device to generate a high side current/voltage detecting signal to the fifth pin.

6. The integrated power module packaging structure of claim 5, further comprising a sixth pin disposed on the first circuit board and passing through the second circuit board, wherein the low side current detecting device detects the power supply device to generate a low side current detecting signal to the sixth pin.

7. The integrated power module packaging structure of claim 6, further comprising a controller disposed out the housing, wherein the controller receives the high side current/voltage detecting signal from the fifth pin and the low side current detecting signal from the sixth pin.

8. The integrated power module packaging structure of claim 7, wherein the controller is disposed on the third circuit board.

9. The integrated power module packaging structure of claim 8, further comprising a seventh pin disposed between the second circuit board and the third circuit board, wherein the controller controls the driving device through the seventh pin.

10. The integrated power module packaging structure of claim 1, wherein the switching module comprises a power device.

* * * * *